United States Patent [19]

Hisa

[11] Patent Number: 5,410,168
[45] Date of Patent: Apr. 25, 1995

[54] INFRARED IMAGING DEVICE

[75] Inventor: Yoshihiro Hisa, Itami, Japan

[73] Assignee: Mitsubishi Denki Kabushiki Kaisha, Tokyo, Japan

[21] Appl. No.: 143,243

[22] Filed: Oct. 29, 1993

Related U.S. Application Data

[63] Continuation of Ser. No. 929,907, Aug. 17, 1992, abandoned.

[30] Foreign Application Priority Data

Nov. 6, 1991 [JP]  Japan .................................. 3-321317

[51] Int. Cl.6 ...................... H01L 33/00; H01L 29/78
[52] U.S. Cl. .................................. 257/325; 257/442; 257/461; 257/188
[58] Field of Search ................ 257/225, 442, 461, 188

[56]  References Cited

U.S. PATENT DOCUMENTS

| | | | |
|---|---|---|---|
| 4,206,003 | 6/1980 | Koehler | 148/1.5 |
| 4,433,343 | 2/1984 | Levine | 357/30 |
| 4,549,195 | 10/1985 | Bluzer | 357/30 |
| 4,725,559 | 2/1988 | Fraes | 437/5 |
| 4,791,467 | 12/1988 | Amingual et al. | 357/30 |
| 4,859,851 | 8/1989 | Wotherspoon | 250/334 |

FOREIGN PATENT DOCUMENTS

| | | | |
|---|---|---|---|
| 0055114 | 6/1982 | European Pat. Off. | 257/292 |
| 61139073 | 6/1986 | European Pat. Off. | |
| 63046765 | 2/1988 | European Pat. Off. | |
| 63237484 | 10/1988 | European Pat. Off. | |
| 2272766 | 11/1990 | European Pat. Off. | |
| 57-32683 | 2/1982 | Japan | 257/225 |
| 61-188976 | 8/1986 | Japan | 257/225 |
| 63-160776 | 7/1987 | Japan | |
| 63-46765 | 2/1988 | Japan | 257/225 |
| 2272766 | 11/1990 | Japan | 257/225 |
| 2013026 | 8/1979 | United Kingdom | 257/292 |

Primary Examiner—Andrew J. James
Assistant Examiner—Stephen D. Meier
Attorney, Agent, or Firm—Leydig, Voit & Mayer

[57]  ABSTRACT

An infrared imaging device includes a first conductivity type first semiconductor layer having a small energy band gap, a first conductivity type second semiconductor layer have a larger energy band gap and disposed on the first semiconductor layer, a light receiving region of the second conductivity type in the second semiconductor layer and extending into the first semiconductor layer, a second conductivity type region in the second semiconductor layer spaced from the light receiving region, an insulating layer on the second semiconductor layer, and an MIS electrode on the insulating layer between the light receiving region and the second conductivity type region. Recombination of signal charges produced by incident light in the light receiving region and leakage current at the surface of the second semiconductor layer at the light receiving region are reduced. In addition, the numerical aperture of the light receiving region is increased. As a result, a highly reliable monolithic infrared imaging device in which photosensitivity and signal process efficiency are significantly improved is realized.

5 Claims, 5 Drawing Sheets

F I G. 4
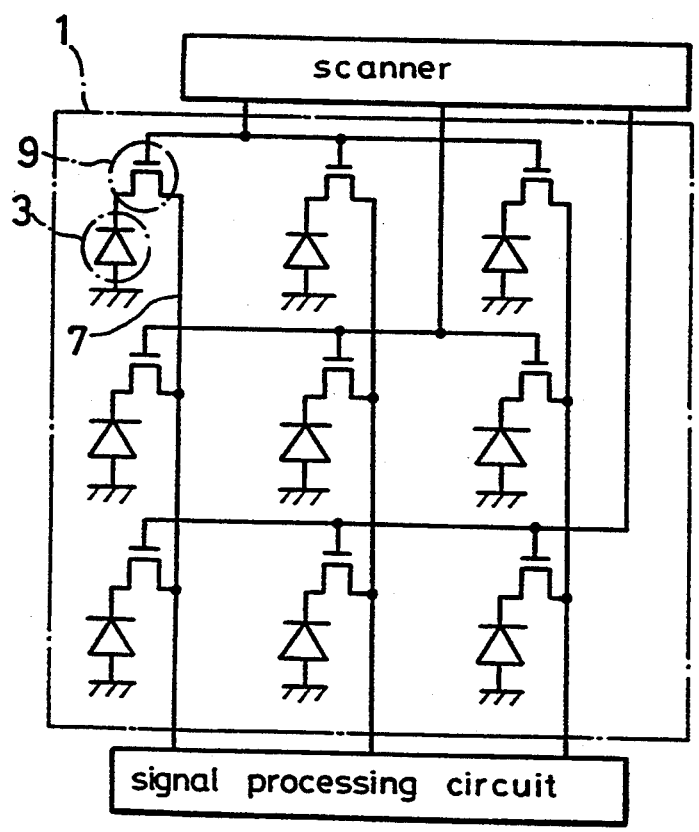

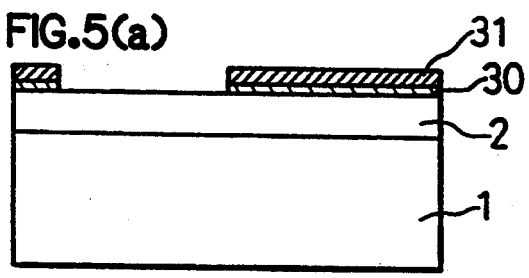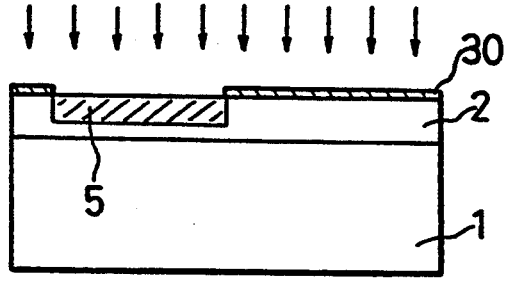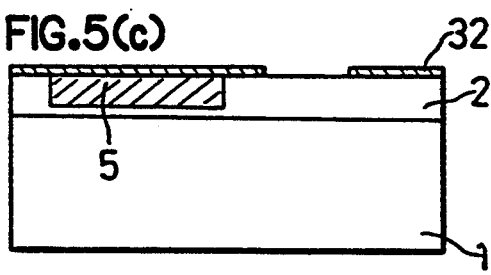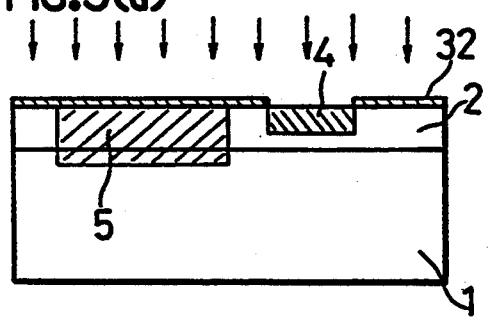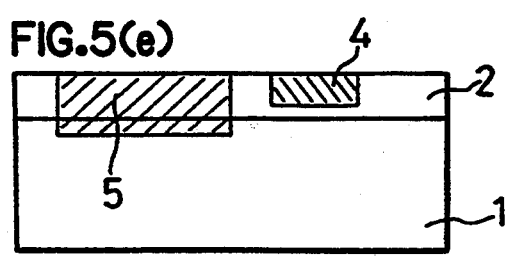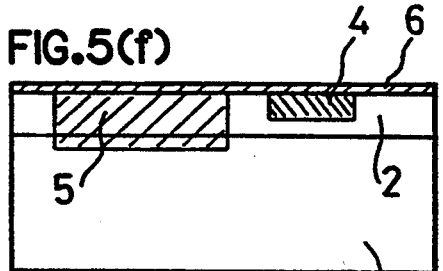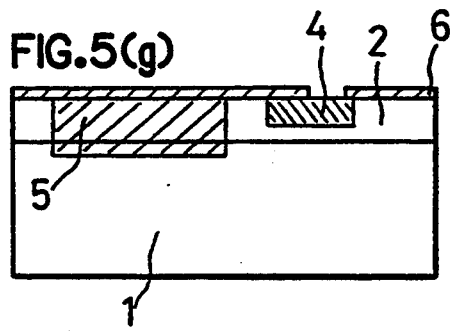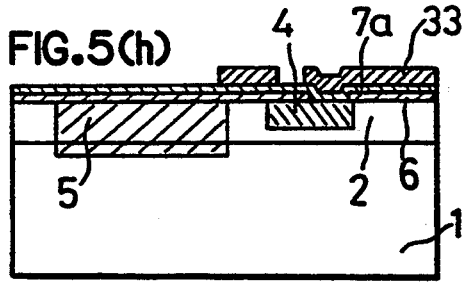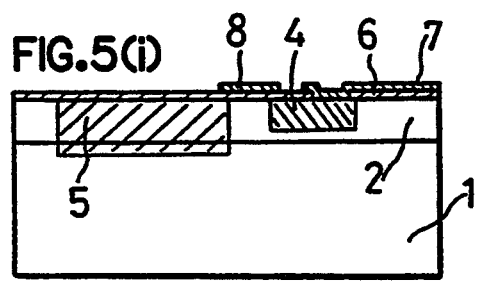

INFRARED IMAGING DEVICE

This disclosure is a continuation of application Ser. No. 07/929,907, filed Aug. 17, 1992, now abandoned.

FIELD OF THE INVENTION

The present invention relates to infrared imaging devices and, more particularly, to a monolithic infrared imaging device.

BACKGROUND OF THE INVENTION

An infrared imaging device in which a light receiving part and signal processing part each formed on a different substrates connected by metal bumps, such as indium bumps, i.e., a hybrid infrared imaging device, has conventionally been utilized. However, in producing such a hybrid infrared imaging device, a troublesome process for connecting those substrates with the metal bumps is required. In addition, since the hybrid infrared imaging device is generally cooled down to about 77∞ K. when used, when the substrate having the light receiving part is different from the substrate having the signal processing part, the metal bump connections are likely to break due to the difference in thermal expansion coefficients of those substrates.

Recently, a monolithic infrared imaging device, which solves the problem of the hybrid type device, has been proposed.

FIG. 7 is a cross-sectional view showing a monolithic infrared imaging device disclosed in Japanese Published Patent Application No. Sho. 63-46765. In FIG. 7, a first CdHgTe layer 12 having a small energy band gap and a second CdHgTe layer 13 having a large energy band gap are disposed on the CdHgTe substrate 11. The second CdHgTe layer 13 is partially removed to expose the first CdHgTe layer 12 on the surface, and a photodiode 14 is formed in the exposed layer 12 by ion implantation or the like. A signal charge injection layer 22 is formed in the second CdHgTe layer 13 by ion implantation or the like and a charge transfer gate 23, a charge storage gate 24 and a CCD 25 are disposed on the second CdHgTe layer 13 via the insulating film 26. The signal charge injection layer 22 and the photodiode 14 are connected by an indium electrode 21. When infrared light is incident on the photodiode 14 formed in the first CdHgTe layer 12 having a small energy band gap, signal charges generated in the photodiode 14 and flow through the indium electrode 21 and signal charge injection layer 22 the charge transfer gate 23, charge storage gate 24 and CCD 25.

Meanwhile, FIG. 8 is a cross-sectional view showing a structure of the monolithic infrared imaging device disclosed in Japanese Patent Published Application No. Hei. 2-272766. In FIG. 8, a second CdHgTe layer 13 having a large energy band gap is disposed on a semiconductor substrate 11. A first CdHgTe layer 12 having a small energy band gap is buried in the second CdHgTe layer 13. A photodiode 14 is formed in the first CdHgTe layer 12, and a source diode 18 and a drain diode 17 are formed in the second CdHgTe layer 13 by ion implantation. A connection electrode 15 connecting the photodiode 14 with the drain diode 17 and a gate electrode 16 connecting the source diode 18 with the drain diode 17 are disposed on the insulating film 19. When infrared light is incident on the photodiode 14 in the first CdHgTe layer 12 having a small energy band gap, signal charges are generated in the photodiode 14 and flow through the connection electrode 15 to reach a MIS (Metal Insulator Semiconductor) switch 20 disposed on the second CdHgTe layer 13. By opening a gate of the MIS switch including the drain diode 17, source diode 18 and gate electrode 16, signal charges are transferred to a signal output electrode (not shown) connected to the drain diode 17 and then output by a charge transfer device (not shown).

The monolithic infrared imaging devices shown in FIGS. 7 and 8 solve the above-described problems of the hybrid imaging devices. In addition, since the monolithic infrared imaging device detects light incident on the rear surface of the substrate, the semiconductor substrate is not restricted to transparent substrates, thereby increasing the degree of freedom in selecting materials.

In these monolithic infrared imaging devices, in order to improve the sensitivity to infrared light in the 10 micron wavelength band, the photodiode is disposed in the semiconductor layer having an energy band gap as small as 0.1 eV. Further, in order to suppress dark current (leakage current) in the MIS structure, the signal processing part including the CCD and the MIS switch are formed on the semiconductor layer having a large energy band gap.

In the monolithic infrared imaging device shown in FIG. 8, although the leakage current in the MIS switch is reduced, since the photodiode 14 is disposed in the semiconductor layer 12 having a small energy band gap, 0.1 eV, and both ends of the p-n junction constituting the photodiode 14 are present at the surface of the semiconductor layer 12 having the small energy band gap, a surface leakage current is induced. As a result, signal charges are not transferred to the signal processing part with high efficiency. Further, the photodiode 14 in the semiconductor layer 12 is connected to the MIS switch including the source diode 18, drain diode 17 and gate electrode 16 via the connection electrode 15 and an end of the p-n junction of the photodiode 14 and its vicinity are covered with the connection electrode 15, so that the numerical aperture of the photodiode 14 is decreased. In addition, since the connection electrode 15 and the MIS switch 20 occupy a large area of the light receiving surface, the light receiving region is reduced as the integration density is increased. As a result, light having a small area cannot be detected accurately.

In the monolithic infrared imaging device shown in FIG. 7, since the both ends of the p-n junction of the photodiode 14 are covered with the semiconductor layer 13 having a large energy band gap, the surface leakage current is suppressed. However, since the signal charge injection layer 22 in the semiconductor layer 13 is connected to the photodiode 14 in the semiconductor layer 12 by the columnar electrode 21, the surface of the photodiode 14 is partially covered with the electrode 21, whereby the numerical aperture of the photodiode 14 is decreased. In addition, since each end of the electrode 21 is present on a different plane, the connection precision of the electrode 21 is lowered, with the result that the reliability of the device is reduced.

Furthermore, in the devices shown in FIGS. 7 and 8, since the light receiving surface of the photodiode 14 is exposed on the surface of the semiconductor layer 12 having a small energy band gap, signal charges generated in the vicinity of the p-n junction are likely to reach the light receiving surface and recombine, so that the signal charges cannot be processed with high efficiency.

SUMMARY OF THE INVENTION

An object of the present invention is to provide a monolithic infrared imaging device having a high sensitivity, in which recombination of signal charges and surface leakage current in the light receiving region are reduced, dark current in the signal processing circuit is reduced, numerical aperture of the light receiving region is increased, electrode connection precision is improved and signal charges are processed with high efficiency.

Other objects and advantages of the present invention will become apparent from the detailed description given hereinafter. It should be understood, however, that the detailed description and specific embodiments are given by way of illustration only since various changes and modifications within the spirit and scope of the invention will be apparent to those of skill in the art.

According to an aspect of the present invention, an infrared imaging device comprises a first conductivity type first semiconductor layer having a small energy band gap, a first conductivity type second semiconductor layer having a large energy band gap and disposed on the first semiconductor layer, a light receiving region of the second conductivity type extending through the second semiconductor layer into the first semiconductor layer, a second conductivity type impurity diffusion region in the second semiconductor layer spaced from the light receiving region, an insulating layer disposed on the second semiconductor layer, and an MIS electrode disposed on the insulating layer between the light receiving region and the second conductivity type region.

In this structure, the surface of the light receiving region, both ends of the p-n junction of the light receiving region and both ends of the p-n junction of the second conductivity type region are all disposed in the second semiconductor layer having a large energy band gap, so that recombination of signal charges in the light receiving region and leakage current at the surface of the light receiving region are reduced and dark current is reduced. In addition, an MIS switch includes the light receiving region (source region), the second conductivity type region (drain region) and the MIS electrode, so that there is little reduction in the numerical aperture of the light receiving region and there is little decrease in the area of the light receiving region on the whole surface of the device. Furthermore, since the MIS electrode is a metal plate and disposed on a flat surface, the connection precision of the electrode is improved.

BRIEF DESCRIPTION OF THE DRAWINGS

FIG. 4 is a schematic diagram showing a circuit construction of the infrared imaging devices shown in FIGS. 1 to 3;

FIGS. 5(a) to 5(i) are cross-sectional views of process steps for producing the infrared imaging device of FIG. 1;

DETAILED DESCRIPTION OF THE PREFERRED EMBODIMENTS

Embodiments of the present invention will be described in detail with reference to the drawings.

Figure 1:
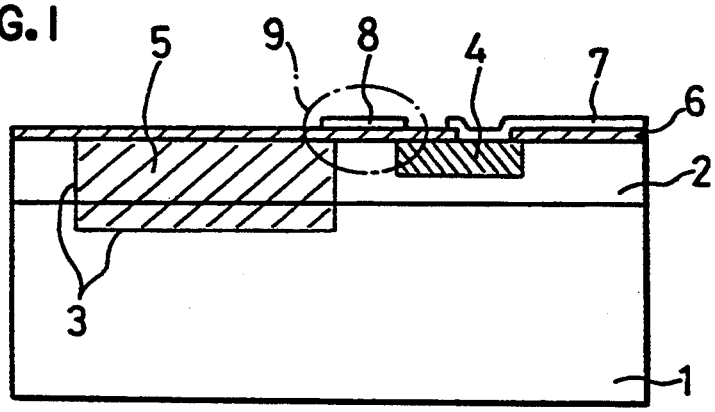
FIG. 1 is a cross-sectional view showing an infrared imaging device in accordance with a first embodiment of the present invention.

FIG. 1 is a cross-sectional view showing a structure of an infrared imaging device in accordance with a first embodiment of the present invention. In FIG. 1, a p type semiconductor layer 2 having a thickness of 1 to 3 microns and a large energy band gap is disposed on a p type semiconductor substrate 1 having a thickness of about 10 microns and a small energy band gap. An n type light receiving region 5 penetrates the p type semiconductor layer 2 and extends into the substrate 1. This light receiving region 5 is 10 to 20 microns square in shape in a cross-section parallel to the wafer surface. A high dopant impurity concentration n type region 4 is disposed in the p type semiconductor layer 2 at a prescribed distance from the light receiving region 5. This n type region 4 is 2 to 5 microns square in shape in a cross-section parallel to the wafer surface. An insulating film 6 is disposed on the p type semiconductor layer 2. A MIS electrode 8 1 to 2 microns wide is disposed on the insulating film 6 between the light receiving region 5 and the n type region 4 and an end of the MIS electrode 8 overlaps an end of the p-n junction of the light receiving region 5 while the other end of the MIS electrode 8 overlaps with an end of the p-n junction of the n type region 4. The insulating film 6 has an aperture to expose a part of the n type region 4 and an electrode 7 is disposed on the exposed part of the n type region 4 and extends onto the insulating film. The electrode 7 is connected to a signal processing circuit (not shown).

FIGS. 5(a) to 5(i) illustrate process steps for producing the infrared imaging device of FIG. 1. In these figures, the same reference numerals as those in FIG. 1 designate the same or corresponding parts. Reference numerals 30 and 32 designate masks for ion implantation and numerals 31 and 33 designate photoresist patterns.

First of all, a p type semiconductor layer 2 comprising $Cd_xHg_{1-x}Te$ (x>0.3) and having a thickness of 1 to 3 microns and a large energy band gap, 1 eV, is grown on a p type semiconductor substrate 1 comprising $Cd_xHg_{1-x}Te$ (x≈0.2) having a thickness of about 10 microns and a small energy band gap, 0.1 eV. Then, a $SiO_2$ film and a photoresist are deposited on the entire surface and the photoresist is patterned by a conventional photolithographic technique. Then, using the photoresist pattern 31 as a mask, the $SiO_2$ film is etched by wet etching using hydrofluoric acid or the like, resulting in a mask for ion implantation 30 comprising $SiO_2$ shown in FIG. 5(a).

After removing the photoresist pattern 31, boron ions are implanted through the entire surface at about 100 kV and then the substrate 1 is annealed at about 200° C., forming an n type light receiving region 5 shown in FIG. 5(b).

After removing the mask 30, another mask for ion implantation 32 is formed as shown in FIG. 5(c) in the same way as described above.

As shown in FIG. 5(d), boron ions are implanted through the entire surface and then the substrate 1 is annealed, forming a high dopant concentration n type region 4 having a carrier concentration of $10^{18}$ cm$^{-3}$ order. At this time, the n type light receiving region 5 extends through the p type semiconductor layer and the p-n junction reaches into the substrate 1, so that the carrier concentration of the light receiving region 5 is lowered to the order of $10^{15}$ cm$^{-3}$.

After removing the mask 32 as shown in FIG. 5(e), an insulating film 6 comprising $SiO_2$ is formed on the entire surface of the substrate as shown in FIG. 5(f).

Then, a photoresist pattern is formed on the insulating film 6 in the same way as described above, and the insulating film 6 is etched by wet etching using hydrofluoric acid or the like as an etchant and using the photoresist pattern as a mask to form an aperture penetrating the insulating film 6, as shown in FIG. 5(g).

Thereafter, an electrode metal layer 7a comprising Cr/Au is deposited on the entire surface and a photoresist is deposited thereon. Then, the photoresist is patterned using conventional photolithography and etching technique as shown in FIG. 5(h).

Then, a portion of the electrode metal layer 7a is removed by wet etching using HCl as an etchant and using the photoresist pattern 33 as a mask, resulting in an electrode which is connected to a signal processing circuit (not shown), and a MIS electrode 8.

A description is given of the operation of this device with reference to FIGS. 1 and 4. FIG. 4 is a schematic diagram showing a circuit construction of the infrared imaging device of FIG. 1.

When infrared light in the 10 micron wavelength band is incident on the light receiving surface on which the MIS switch 9 and the electrode 7 are present, the infrared light having an energy larger than the energy band gap of the semiconductor substrate 1 is absorbed by the semiconductor substrate 1, generating electron-hole pairs. Then, the electron-hole pairs generated in a depletion layer in the vicinity of the p-n junction 3 formed between the light receiving region 5 and the substrate 1 and the electron-hole pairs generated outside the depletion layer and diffusing into the depletion layer are separated into electrons and holes by the electric field in the depletion layer, inducing an electromotive force at the p-n junction. When a positive bias is applied to the MIS electrode 8, electrons are attracted to the surface of the p type semiconductor layer 2 having a large energy band gap and the conductivity type of the layer 2 is effectively inverted to n type. Simultaneously with the inversion, charges corresponding to the electromotive force generated at the p-n junction 3 flow into the signal processing circuit through the inverted region, the high dopant concentration n type charge storage region 4 and the electrode 7. The charges are processed in the signal processing circuit, whereby the intensity of the infrared light, which is incident on each light receiving layer (pixel), is determined. Practically, when MIS switches in a row are turned ON, output signals from all pixels in that row are transferred to the signal processing circuit, separated by column with time. The MIS switches in the first row are turned ON to read out the output signals in the first row. Then, the MIS switches in the first row are turned OFF and the MIS switches in the second row are turned ON to read out the output signals in the second row. In this way, the output signals in all rows are read out, whereby the intensity distribution of the infrared light on the light receiving surface is determined.

In the infrared imaging device according to the first embodiment of the present invention, the p-n junction 3 at the bottom of the light receiving region 5 is formed in the p type semiconductor substrate 1 having a small energy band gap, 0.1 eV, while the surface of the light receiving region 5 and both ends of the p-n junction 3 are present at the surface of the semiconductor layer 2 having a large energy band gap, 1 eV. Therefore, the sensitivity of the light receiving region 5 to infrared light is improved, recombination of signal charges at the light receiving surface are reduced, and surface leakage current at the ends of the p-n junction is reduced. In addition, the MIS switch 9, transferring the signal charges generated in the light receiving region 5 to the signal processing circuit, includes the light receiving region 5, the high dopant concentration n type region 4 in the semiconductor layer 2 having a large energy band gap, and the MIS electrode 8 formed therebetween. Therefore, the tunneling current generated when a bias voltage is applied to the MIS electrode 8 is reduced, and the greater part of the signal charges generated in the light receiving region are transferred to the signal processing circuit, without recombination, through the inverted region beneath the MIS switch, the high dopant concentration n type region and the electrode. In addition, the MIS electrode 8 has such a narrow width that an end thereof slightly overlaps an end of the p-n junction 3 of the light receiving region 5 while the other end of the electrode 8 slightly overlaps an end of the p-n junction of the high concentration n type region 4. That is, only one end of the light receiving region 5 is covered with the electrode 8, thereby increasing the numerical aperture of the light receiving region 5. In addition, since the MIS switch 9 occupies less area on the whole surface of the device as compared with the conventional device, the light receiving region is increased. Further, since the MIS electrode 8 is formed on a flat surface, the connection precision thereof is improved.

Figure 2:
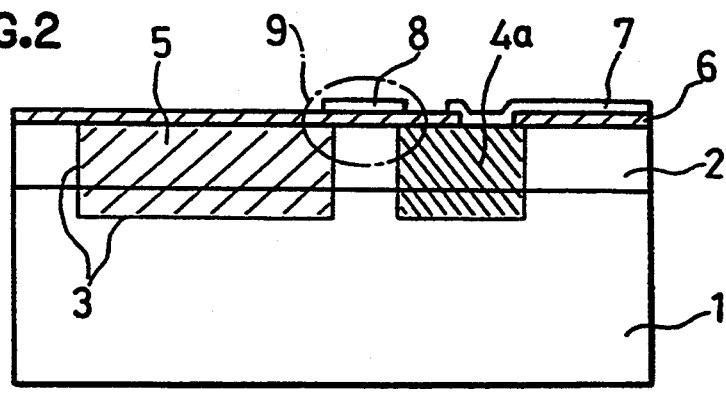
FIG. 2 is a cross-sectional view showing an infrared imaging device in accordance with a second embodiment of the present invention.

FIG. 2 is a cross-sectional view of a pixel of an infrared imaging device in accordance with a second embodiment of the present invention. In FIG. 2, the same reference numerals as those in FIG. 1 designate the same or corresponding parts. In this second embodiment, the light receiving region 5 and the high dopant concentration n type region 4a are formed in the same step and the n type region 4a reaches into the p type substrate 1 having a small energy band gap. In this case, both the light receiving region 5 and the n type region 4a have carrier concentrations as high as $10^{18}$ cm$^{-3}$.

In the infrared imaging device according to the second embodiment, the ends of the p-n junctions of the light receiving region 5 and the n type region 4a are present at the surface of the semiconductor layer 2 having a large energy band gap, 1 eV. Therefore, leakage current at the surface of the light receiving region and dark current in the MIS switch 9 are reduced, signal charges generated in the light receiving region are transferred to the signal processing circuit with high efficiency, so that any reduction in the numerical aperture and the area of the light receiving region are suppressed. In addition, since the light receiving region 5 and the n type region 4a are formed in the same step, the production process is simplified.

In this second embodiment, however, since the carrier concentration of the light receiving region 5 is as the order of high as $10^{18}$ cm$^{-3}$, more electron-hole pairs, which are generated in the light receiving region 5, recombine as compared with the device of FIG. 1, so that the sensitivity of the light receiving region 5 is a little lower than in the device of FIG. 1.

In addition, the carrier concentration of the light receiving region 5 and the n type region 4a may be lower than $10^{18}$ cm$^{-3}$. When the carrier concentration of the light receiving region 5 is, for example, on the order of $10^{15}$ cm$^{-3}$, the recombination of electron-hole pairs generated in the light receiving region 5 is decreased. In this case, however, since the n type region 4a also has a low carrier concentration, the signal processing efficiency decreases in the n type region 4a.

Figure 3:
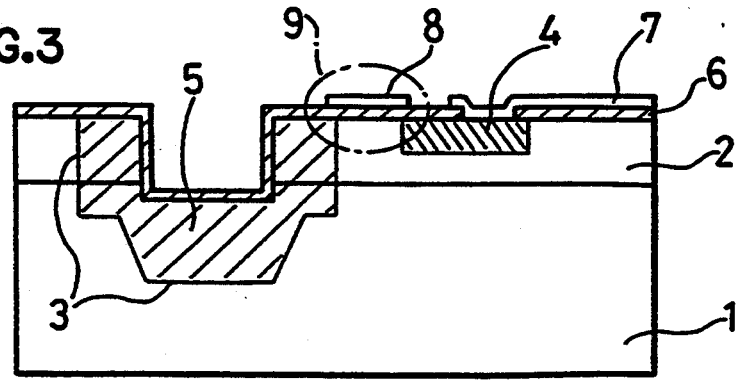
FIG. 3 is a cross-sectional view showing an infrared imaging device in accordance with a third embodiment of the present invention.

FIG. 3 is a cross-sectional view of a pixel of an infrared imaging device in accordance with a third embodiment of the present invention. In FIG. 3, the same reference numerals as those shown in FIG. 1 designate the same or corresponding parts. In this infrared imaging device, an aperture penetrates the p type semiconductor region 2 and the light receiving layer 5 surrounds the aperture.

FIGS. 6(a) to 6(k) are cross-sectional views of process steps for producing the infrared imaging device of FIG. 3. In these figures, the same reference numerals as those in FIGS. 5(a) to 5(i) designate the same or corresponding parts.

First of all, a p type $Cd_xHg_{1-x}Te$ (x>0.3) layer 2 having a thickness of about 1 to 3 microns and an energy band gap as large as 1 eV is grown on a p type $Cd_xHg_{1-x}Te$ (x≈0.2) substrate 1 having a thickness of about 10 microns and an energy band gap as small as 0.1 eV. Thereafter, a photoresist is deposited on the p type semiconductor layer 2 and patterned by conventional photolithography and etching techniques to form a photoresist pattern 34. Then, using the pattern 34 as a mask, the p type semiconductor layer 2 beneath the aperture of the pattern 34 is completely removed by wet etching using bromine in methanol as an etchant or by ion etching (FIG. 6(a)).

After removing the photoresist pattern 34, a $SiO_2$ film 35 is deposited on the entire surface. Then, a photoresist is deposited on the $SiO_2$ film 35 and patterned by conventional photolithography and etching techniques to form a photoresist pattern 36 (FIG. 6(b)).

Figure 6A:
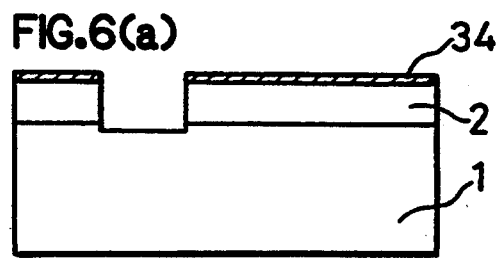
FIGS. 6(a) to 6(k) are cross-sectional views of process steps for producing the infrared imaging device of FIG. 3.
Figure 6B:
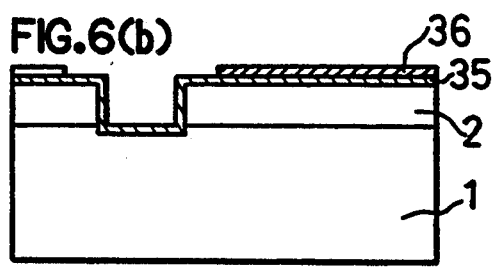
Figure 6C:
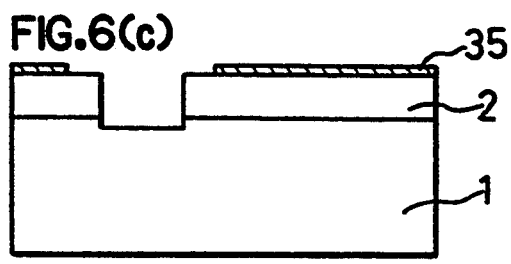
Figure 6D:
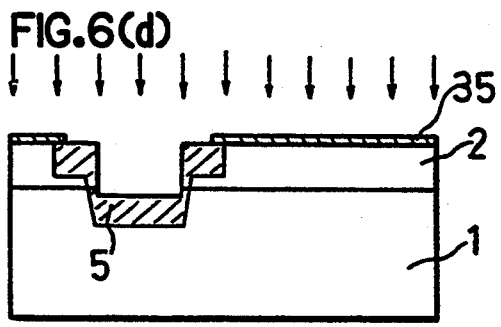
Figure 6E:
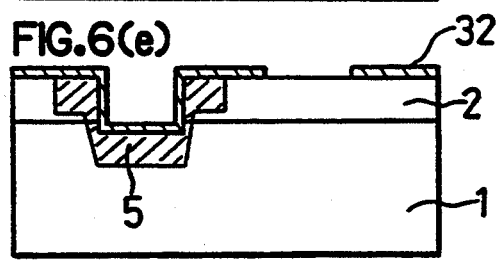
Figure 6F:
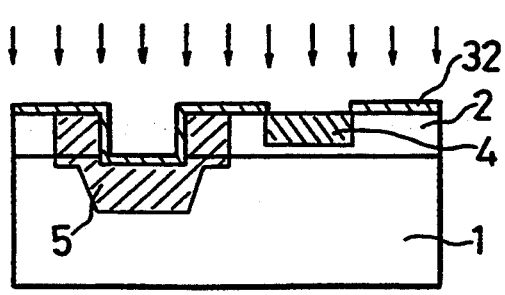
Figure 6G:
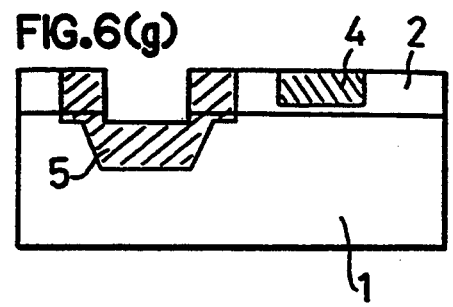
Figure 6H:
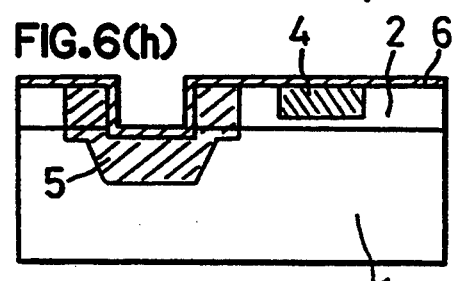
Figure 6I:
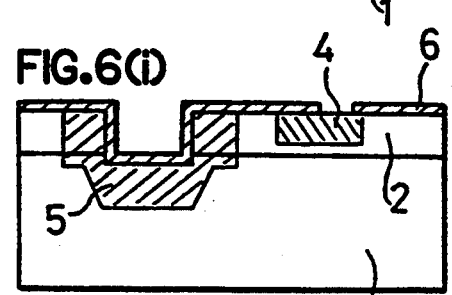
Figure 6J:
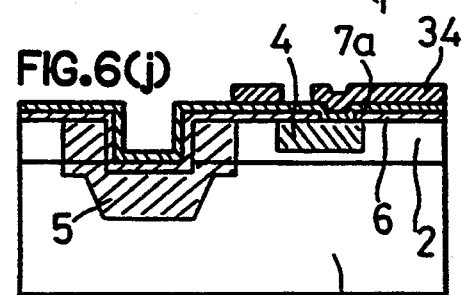
Figure 6K:
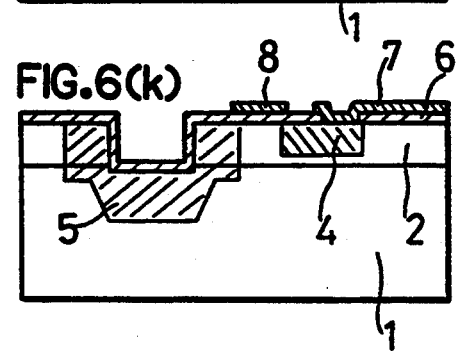
Figure 7:
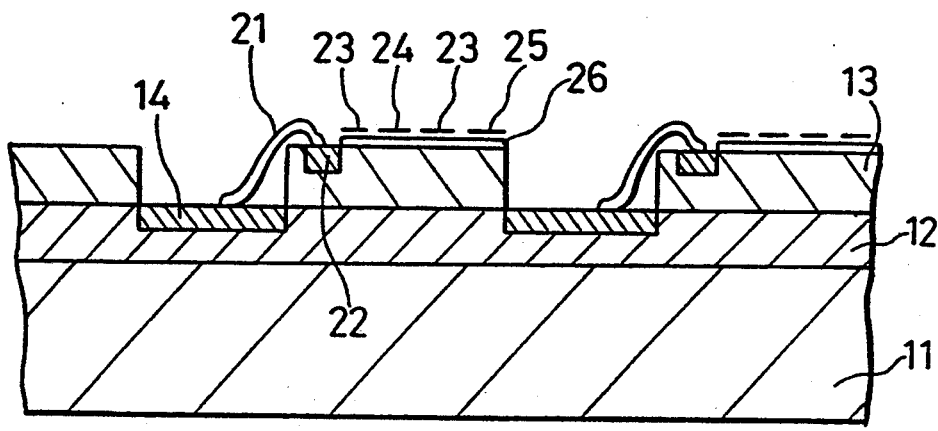
FIG. 7 is a cross-sectional view showing a prior art infrared imaging device.
Figure 8:
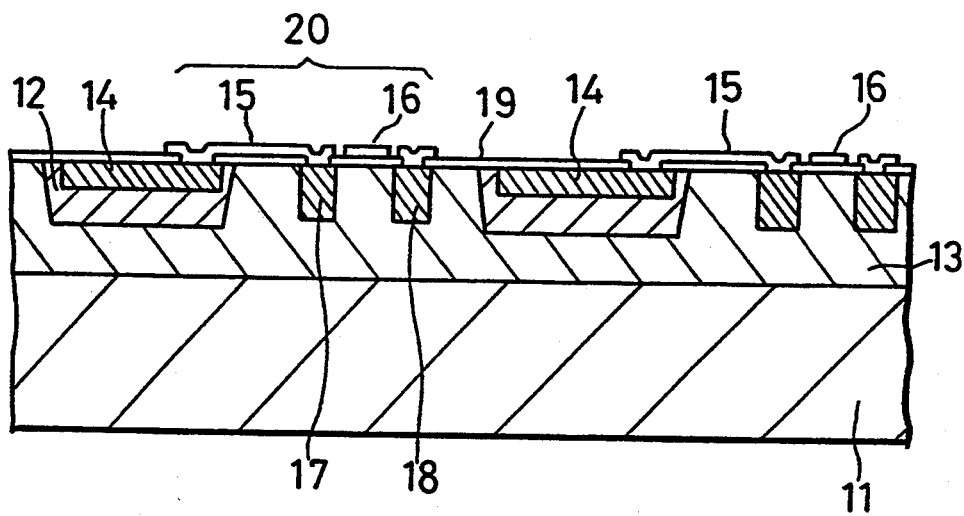
FIG. 8 is a cross-sectional view showing another prior art infrared imaging device.

Then, using the photoresist pattern 36 as a mask, a portion of the $SiO_2$ film 35 is removed by wet etching using hydrofluoric acid and, thereafter, the photoresist pattern 36 is removed (FIG. 6(c)).

Then, boron ions are implanted using the $SiO_2$ film 35 as a mask to form an n type light receiving region 5 in the p type semiconductor substrate 1 and the p type semiconductor layer 2.

The steps shown in FIGS. 6(e) to 6(k) are identical to the steps shown in FIGS. 5(d) to 5(i) according to the first embodiment, so that descriptions therefor will be omitted.

In this third embodiment of the present invention, the same effects as described in the first embodiment are obtained. In addition, since it is not necessary to precisely control the depth of the p-n junction of the light receiving region 5, the production yield is improved.

In the above-described first to third embodiments, the energy band gap of the p type semiconductor substrate 1 is 0.1 eV and the energy band gap of the p type semiconductor layer 2 is 1 eV. However, the effects of the present invention can be achieved so long as the former is in a range of 0.1±0.01 eV and the latter is larger than 0.2 eV.

Furthermore, in the first to third embodiments of the present invention, the p type semiconductor substrate 1 having a small energy band gap may be epitaxially grown on a conventional CdTe substrate. Also in this case, the same effects as described above can be achieved.

Furthermore, in the first to third embodiments of the present invention, the n type region 4 (4a) is covered by the insulating film 6 and the electrode 7. However, since light incident on the region 4 (4a) causes noise, the region 4 (4a) may be covered by a metal film or the like that reflects visible light while transmitting infrared light.

As is evident from the foregoing description, according to the present invention, the surface of the light receiving region, an end of the p-n junction of the light receiving region and an end of the p-n junction of the impurity diffusion layer for transferring signal charges generated in the light receiving region to a signal processing circuit are all disposed in a semiconductor layer having a large energy band gap. In addition, a MIS electrode is disposed on the semiconductor region between the light receiving layer and the impurity diffusion layer, and the MIS electrode, the light receiving region and the impurity diffusion region constitutes a MIS switch for transferring signal charges to the signal processing circuit. Therefore, recombinations of signal charges in the light receiving region and leakage current at the surface of the light receiving region are reduced, and the numerical aperture of the light receiving layer is increased and the area of the light receiving region is increased, whereby the photosensitivity of the light receiving layer is enhanced. In addition, the connecting precision of the MIS electrode at the MIS switch part is high and the signal charges generated in the light receiving layer are stably transferred to the signal processing circuit. As a result, a highly reliable monolithic infrared imaging device, in which photosensitivity and signal processing efficiency are significantly improved, is realized.

What is claimed is:

1. An infrared imaging device comprising:
   a first conductivity type first semiconductor layer having a first, relatively small energy band gap;
   a first conductivity type second semiconductor layer having a second energy band gap larger than the first energy band gap disposed on the first semiconductor layer and having a surface opposite the first semiconductor layer;
   a light receiving region of the second conductivity type extending from the surface of the second semiconductor layer into the first semiconductor layer and forming a pn junction for collecting charge carriers generated in response to incident infrared light;
   a second conductivity type region in the second semiconductor layer, extending into the first semiconductor layer, and spaced from the light receiving region;
   an electrically insulating layer disposed on the surface; and
   an MIS electrode disposed on the electrically insulating layer between, electrically insulated from, and partially overlapping the light receiving region and the second conductivity type region for controlling transfer of charge carriers from the light receiving region to the second conductivity type region.

2. The infrared imaging device of claim 1 wherein the first energy band gap of the first semiconductor layer is 0.1±0.01 eV and the second energy band gap of the second semiconductor layer is at least 0.2 eV.

3. The infrared imaging device of claim 1 wherein the light receiving region contains a dopant impurity producing a charge carrier concentration in the light receiving region on the order of $10^{15}$ cm$^{-3}$ and the second conductivity type region contains a dopant impurity producing carrier concentration in the second conductivity type region on the order of $10^{18}$ cm$^{-3}$.

4. The infrared imaging device of claim 1 wherein the light receiving region is 10 to 20 microns square in shape in a cross-section parallel to the surface, the second conductivity type region is 1 to 2 microns square in shape in a cross-section parallel to the surface, and the MIS electrode is 1 to 2 microns wide between the light receiving and second conductivity type regions.

5. The infrared imaging device of claim 1 including a second electrode contacting the second conductivity type region.

* * * * *